United States Patent
Chiang et al.

(10) Patent No.: US 7,999,783 B2
(45) Date of Patent: Aug. 16, 2011

(54) SHIFT REGISTER WITH SHIFT REGISTER UNIT HAVING OUTPUT TERMINAL NON-CONTINUOUSLY RECEIVING LOW VOLTAGE AND LIQUID CRYSTAL DISPLAY USING THE SAME

(75) Inventors: Chien-Hsueh Chiang, Miao-Li (TW); Sz-Hsiao Chen, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 864 days.

(21) Appl. No.: 12/005,690

(22) Filed: Dec. 28, 2007

(65) Prior Publication Data

US 2008/0158132 A1 Jul. 3, 2008

(30) Foreign Application Priority Data

Dec. 29, 2006 (TW) ................. 95149714 A

(51) Int. Cl.
G09G 3/36 (2006.01)
(52) U.S. Cl. ...................................................... 345/100
(58) Field of Classification Search .................. 345/100, 345/87, 99; 327/241
See application file for complete search history.

(56) References Cited

U.S. PATENT DOCUMENTS

| 5,701,136 | A | 12/1997 | Huq et al. |
| 6,765,980 | B2 | 7/2004 | Azuma et al. |
| 7,292,218 | B2 * | 11/2007 | Lin et al. ....................... 345/100 |
| 2005/0156860 | A1 * | 7/2005 | Kim et al. ....................... 345/100 |
| 2006/0117203 | A1 * | 6/2006 | Jonnalagadda ............... 713/400 |
| 2007/0040792 | A1 * | 2/2007 | Kwag et al. ................... 345/100 |
| 2007/0274432 | A1 * | 11/2007 | Yu .................................. 377/64 |

* cited by examiner

Primary Examiner — Chanh Nguyen
Assistant Examiner — Kwang-Su Yang
(74) Attorney, Agent, or Firm — Wei Te Chung

(57) ABSTRACT

An exemplary shift register (20) includes a plurality of shift register units (200) connected one by one. Each of the shift register units includes a first switch unit (201), a second switch unit (202), a third switch unit (203), a fourth switch unit (204), and a fifth switch unit (205). A signal input terminal of each shift register unit is coupled to an output terminal of a rear-stage shift register unit. A first clock input terminal receives a first clock signal to turn on/off the first and second switch units. The third switch unit receives a second clock signal. The fourth switch unit pulls up the output voltage of the output terminal according to a controlling signal from the first switch unit. The fifth switch unit pulls down the output voltage of the output terminal according to controlling signals from the second and third switch units.

20 Claims, 4 Drawing Sheets

SHIFT REGISTER WITH SHIFT REGISTER UNIT HAVING OUTPUT TERMINAL NON-CONTINUOUSLY RECEIVING LOW VOLTAGE AND LIQUID CRYSTAL DISPLAY USING THE SAME

FIELD OF THE INVENTION

The present invention relates to a shift register having fewer transistors. The shift register outputs waveforms with smaller distortion. The present invention also relates to a liquid crystal display (LCD) employing the shift register.

GENERAL BACKGROUND

An LCD has the advantages of portability, low power consumption, and low radiation. Therefore, the LCD has been widely used in various portable information products, such as notebooks, personal digital assistant (PDA), video cameras, and the like.

In general, an LCD includes a gate driver and a data driver. The gate and data drivers drive thin film transistors (TFTs) of an LCD panel of the LCD to display images. Each of the gate and data drivers includes a shift register having a plurality of shift register units connected one by one. Each of the shift register units includes an input terminal and an output terminal. The output terminal of each shift register unit is connected to the input terminal of a rear-stage shift register unit and provides a feedback signal to a pre-stage shift register unit.

FIG. 5 is a circuit diagram of a shift register unit of a conventional shift register employed in an LCD. The shift register unit 100 includes a first transistor 101, a second transistor 102, a third transistor 103, a fourth transistor 104, a fifth transistor 105, and a sixth transistor 106.

A gate electrode of the first transistor 101 is connected to a first clock input terminal CKb, and a drain electrode of the first transistor 101 is connected to a signal input terminal $V_{IN1}$ for receiving input signals from the pre-stage shift register unit (not shown). Further, a source electrode of the first transistor 101 is connected to a gate electrode of the fourth transistor 104. A drain and gate electrodes of the second transistor 102 are connected to a high voltage input terminal $V_{DD}$. Further, the source electrode of the second transistor 102 is connected to a drain electrode of the third transistor 103 and a gate electrode of the fifth transistor 105, respectively.

A gate electrode of the third transistor 103 is connected to a source electrode of the fourth transistor 104, a drain electrode of the fifth transistor 105, and an output terminal $V_{out1}$ of the shift register unit 100, respectively. A source electrode of the third transistor 103 and a source electrode of the fifth transistor 105 are connected to a low voltage input terminal $V_{SS}$. A drain electrode of the fourth transistor 104 is connected to a second clock input terminal CK. A drain electrode of the sixth transistor 106 is connected to the output terminal $V_{out1}$ of the shift register unit 100, and a source electrode of the sixth transistor 106 is connected to the low voltage input terminal $V_{SS}$. Further, a gate electrode of the sixth transistor 106 is connected to an output terminal $V_{out2}$ of a rear-stage shift register unit (not shown).

The fourth transistor 104 is configured for pulling up the output voltage of the output terminal $V_{out1}$ from a low voltage. The fifth and sixth transistors 105, 106 are configured for pulling down the output voltage of the output terminal $V_{out1}$ from a high voltage. Therefore, a large current may float through the fourth, fifth, and sixth transistors 104, 105, 106. Therefore, each of the fourth, fifth, and sixth transistors 104, 105, 106 has a larger channel width. As a result, a shift register (not shown) employing the shift register unit 100 has a larger volume.

The shift register units of the shift register are connected one by one. The gate electrode of the sixth transistor 106 of the shift register unit 100 receives a feedback signal from a rear-stage shift register unit. The feedback signal is provided to pull down the output voltage of the output terminal $V_{out1}$. Referring to FIG. 6, this is a sequence waveform diagram of pulse signals of the shift register of FIG. 5. The last shift register unit of the shift register outputs a first waveform 17, and a shift register unit adjacent to the last shift register unit outputs a second waveform 15. Because the last shift register unit does not receives a feedback signal, the output voltage of the last shift register unit may not be sufficiently pulled down, as shown in circled portion 10 of the first waveform 17.

Typically, the output voltage of each shift register unit is pulled down to $V_{SS}$ in about 25 microseconds (us). However, during this period, the output voltage of a rear-stage shift register unit is already pulled up. As a result, the adjacent two shift register units may output a same voltage at certain time of this period, as shown in circled portion 12 of FIG. 2. That is, transistors connected to two adjacent data lines or gate lines of an LCD panel may be turned on at the same time. As a result, the LCD operates incorrectly.

What is needed, therefore, is a shift register and an LCD employing the shift register that can overcome the above-described deficiencies.

SUMMARY

A shift register includes a plurality of shift register units connected one by one. Each of the shift register units includes a signal input terminal; an output terminal; a first switch unit coupled to a first clock input terminal and the signal input terminal; a second switch unit coupled to the first clock input terminal and a first voltage input terminal; a third switch unit coupled between the second switch unit and a second voltage input terminal; a fourth switch unit coupled between a second clock input terminal and the output terminal of the shift register unit; and a fifth switch unit coupled between the output terminal and the second voltage input terminal. The signal input terminal of each shift register unit is coupled to the output terminal of a rear-stage shift register unit. The first clock input terminal receives a first clock signal to turn on/off the first and second switch units. The third switch unit receives a second clock signal. The fourth switch unit pulls up the output voltage of the output terminal according to a controlling signal from the first switch unit. The fifth switch unit pulls down the output voltage of the output terminal according to controlling signals from the second and third switch units.

A liquid crystal display includes a drive circuit configured for driving the liquid crystal display. The drive circuit includes a shift register configured for providing controlling signals to the liquid crystal display. The shift register includes a plurality of shift register units connected one by one. Each of the shift register units includes a signal input terminal; an output terminal; a first switch unit coupled to a first clock input terminal and the signal input terminal; a second switch unit coupled to the first clock input terminal and a first voltage input terminal; a third switch unit coupled between the second switch unit and a second voltage input terminal; a fourth switch unit coupled between a second clock input terminal and the output terminal of the shift register unit; and a fifth switch unit coupled between the output terminal and the second voltage input terminal. The signal input terminal of each shift register unit is coupled to the output terminal of a rear-stage shift register unit. The first clock input terminal receives a first clock signal to turn on/off the first and second switch units. The third switch unit receives a second clock signal. The fourth switch unit pulls up the output voltage of the output terminal according to a controlling signal from the first switch unit. The fifth switch unit pulls down the output voltage of the output terminal according to controlling signals from the second and third switch units.

Other novel features and advantages will become more apparent from the following detailed description when taken in conjunction with the accompanying drawings.

DETAILED DESCRIPTION OF PREFERRED EMBODIMENTS

Reference will now be made to the drawings to describe the preferred and exemplary embodiments in detail.

Figure 1:
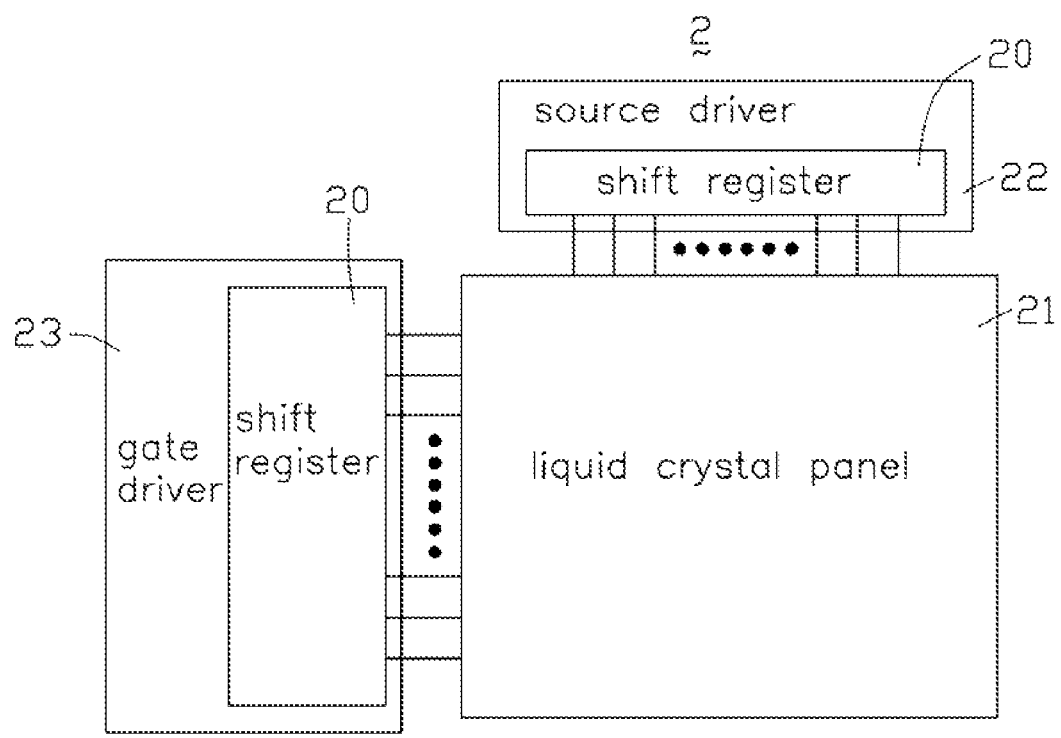
FIG. 1 is a schematic, abbreviated diagram of certain components of an LCD according to an exemplary embodiment of the present invention, the LCD including a shift register.

FIG. 1 is a schematic, abbreviated diagram of certain components of an LCD according to an exemplary embodiment of the present invention. The LCD 2 includes a liquid crystal panel 21, a source driver 22 connected to the liquid crystal panel 21 via a plurality of data lines (not labeled), and a gate driver 23 connected to the liquid crystal panel 21 via a plurality of gate lines (not labeled). The liquid crystal panel 21 includes a plurality of TFT arrays (not shown) for displaying images. Each of the date and gate drivers 22, 23 includes a shift register 20 for providing controlling signals to the liquid crystal panel 21. The shift register 20 may be formed in the same fabricating step as the TFT arrays in a system-on-glass (SOG) LCD.

Figure 2:
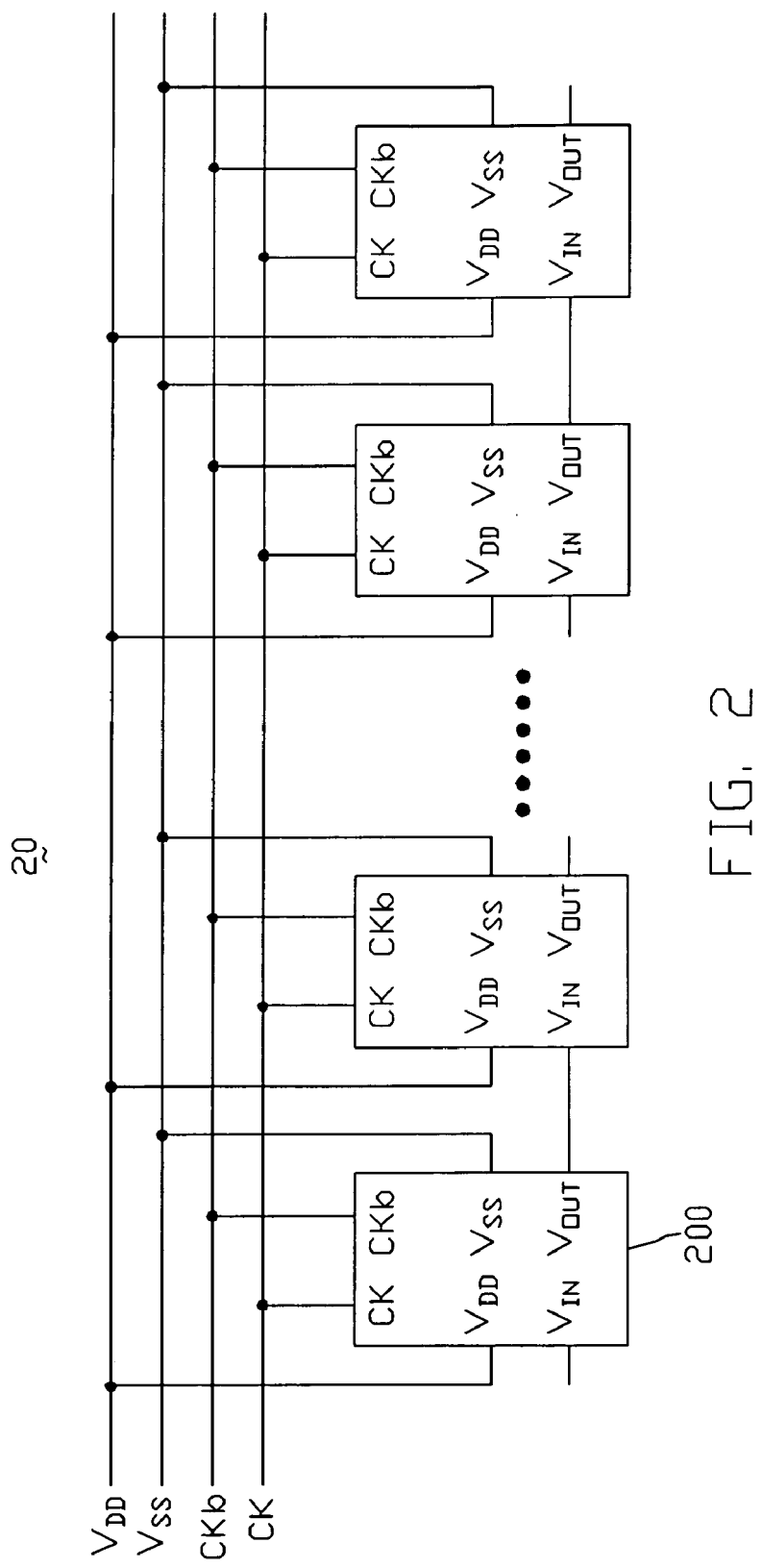
FIG. 2 is an abbreviated block circuit diagram of the shift register of FIG. 1, the shift register including a plurality of shift register units connected one by one.

FIG. 2 is an abbreviated block circuit diagram of the shift register 20 of FIG. 1. The shift register 20 includes a plurality of shift register units 200 connected one by one. All of the shift register units 200 have similar structures. Each of the shift register units 200 includes a first clock input terminal CK for receiving a clock signal, a second clock input terminal CKb for receiving a reverse clock signal, a high voltage input terminal $V_{DD}$, a low voltage input terminal $V_{SS}$, a signal input terminal $V_{IN}$, and an output terminal $V_{OUT}$. The output terminal $V_{OUT}$ of each shift register unit 200 is connected to the signal input terminal $V_{IN}$ of a rear-stage shift register unit. The signal input terminal $V_{IN}$ of the first shift register unit 200 is used as a signal input terminal of the shift register 20. The output terminal $V_{OUT}$ of the last shift register unit 200 is used as an output terminal of the shift register 20.

Figure 3:
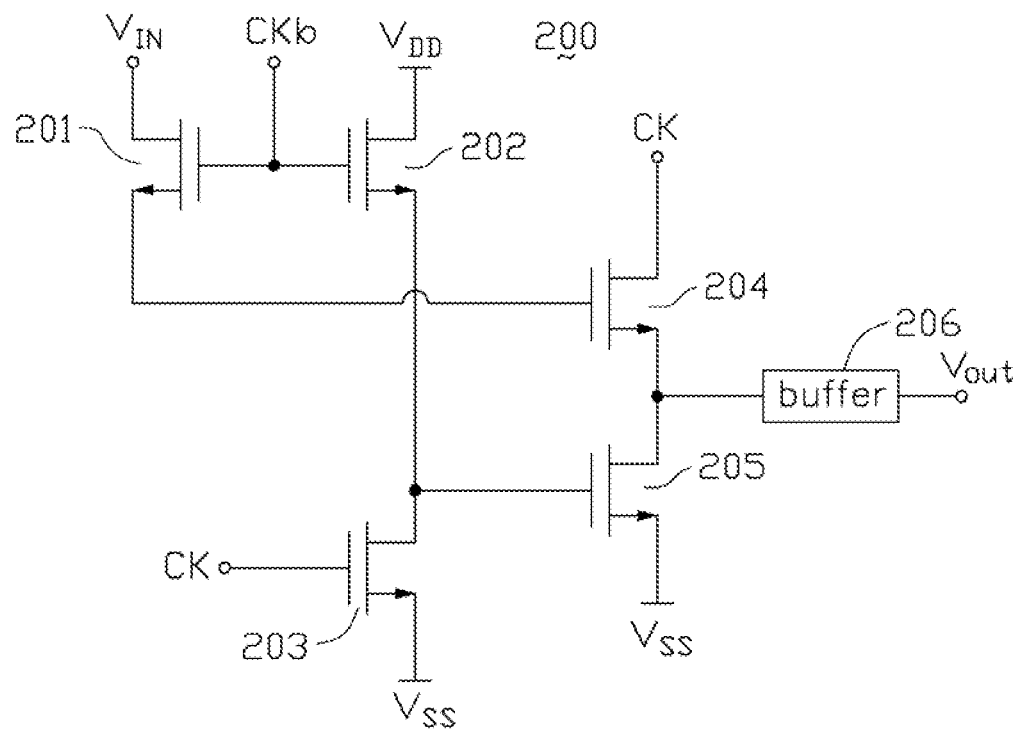
FIG. 3 is a circuit diagram of one of the shift register units of FIG. 2.

Referring also to FIG. 3, this is a circuit diagram of one of the shift register units 200 of FIG. 2. The shift register unit 200 includes a first transistor 201, a second transistor 202, a third transistor 203, a fourth transistor 204, a fifth transistor 205, and a buffer 206. In the illustrate embodiment, the first to fifth transistors 201~205 may be N-channel metal-oxide semiconductor (NMOS) transistors. The buffer 206 includes two inverters (not shown) connected in series. The buffer 206 is configured for reducing distortion of the output waveform of the shift register unit 200.

A drain electrode of the first transistor 201 is connected to the signal input terminal $V_{IN}$, and a gate electrode of the first transistor 201 is connected to the second clock input terminal CKb. Further, a source electrode of the first transistors 201 is connected to a gate electrode of the fourth transistor 204. A gate electrode of the second transistor 202 is connected to the second clock input terminal CKb, and a drain electrode of the second transistor 202 is connected to the high voltage input terminal $V_{DD}$. Further, a source electrode of the second transistor 202 is connected to a drain electrode of the third transistor 203 and a gate electrode of the fifth transistor 205, respectively.

A gate electrode of the third transistor 203 is connected to the first clock input terminal CK, and a source electrode of the third transistor 203 is connected to the low voltage input terminal $V_{SS}$. A drain electrode of the fourth transistor 204 is connected to the first clock input terminal CK, and a source electrode of the fourth transistor 204 is connected to a drain electrode of the fifth transistor 205. A source electrode of the fifth transistor 205 is connected to the low voltage input terminal $V_{SS}$. The buffer 206 is connected between the source electrode of the fourth transistor 204 and the output terminal $V_{OUT}$ of the shift register unit 200.

Figure 4:
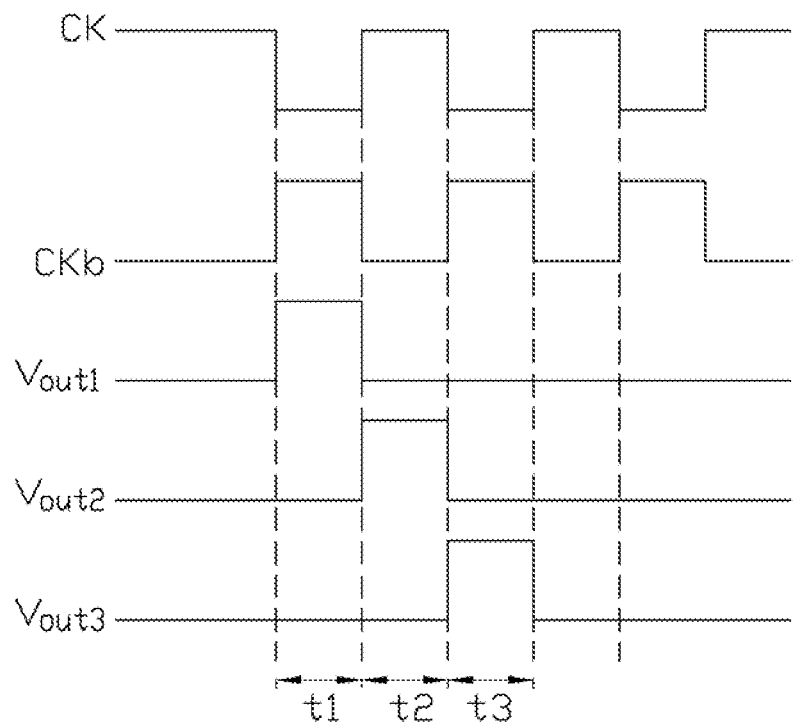
FIG. 4 is a sequence waveform diagram of pulse signals of the shift register of FIG. 2.
Figure 5:
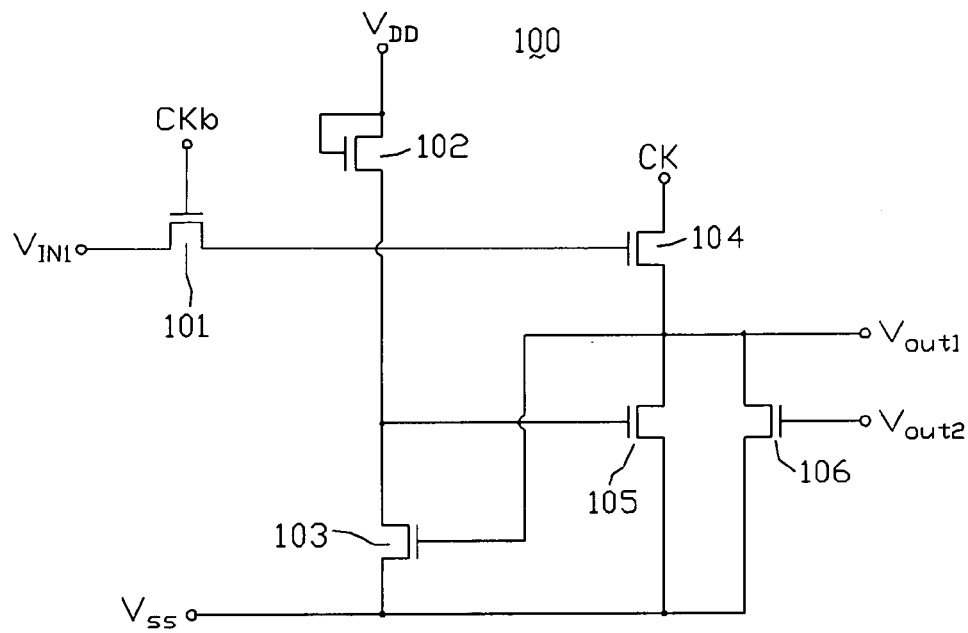
FIG. 5 is a circuit diagram of a shift register unit of a conventional shift register employed in an LCD.
Figure 6:
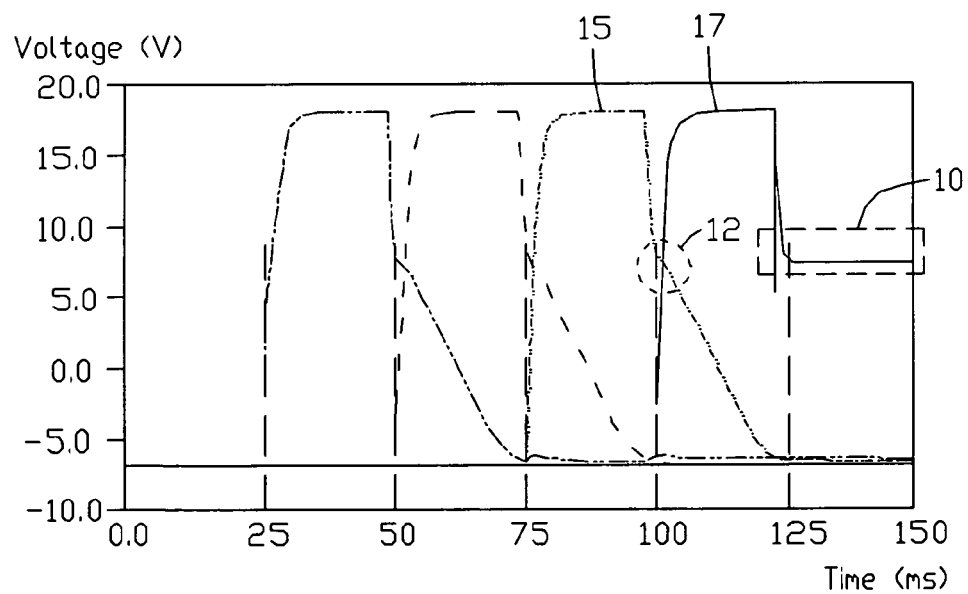
FIG. 6 is a sequence waveform diagram of pulse signals of the shift register of FIG. 5.

Referring also to FIG. 4, this is a sequence waveform diagram of pulse signals of the shift register 20 of FIG. 2. $V_{out1}$, $V_{out2}$, $V_{out3}$ represent output signals of three successive shift register units 200, respectively. Supposing the three successive shift register units 200 are respectively defined as a pre-stage shift register unit, a middle shift register unit, and a rear-stage shift register unit. The output signal $V_{out1}$ of the pre-stage shift register unit is applied to the signal input terminal $V_{IN}$ of the middle shift register unit. The output signal $V_{out2}$ of the middle shift register unit is applied to the signal input terminal $V_{IN}$ of the rear-stage shift register unit.

The pre-stage, middle, and rear-stage shift register units operate on the same principle. Take the middle shift register unit for example, during the first period t1, the first clock signal CK is a low voltage signal and the second clock signal CKb is a high voltage signal. The output signal $V_{out1}$ of the pre-stage shift register unit is a high voltage signal. Thereby, the first and second transistors 201, 202 of the middle shift register unit are turned on and the third transistor 203 of the middle shift register unit is turned off. As a result, the output signal $V_{out1}$ of the pre-stage shift register unit is applied to the gate electrode of the fourth transistor 204 of the middle shift register unit via the first transistor 201. A high voltage $V_{DD}$ is applied to the gate electrode of the fifth transistor 205 of the middle shift register unit via the second transistor 202. Therefore, the fourth and fifth transistors 204, 205 of the middle shift register unit are turned on. The output voltage $V_{out2}$ of the middle shift register unit is pulled down by the low voltage $V_{SS}$ via the fifth transistors 205.

During the second period t2, the first clock signal CK is a high voltage signal and the second clock signal CKb is a low voltage signal. The output signal $V_{out1}$ of the pre-stage shift register unit is a low voltage signal. Thereby, the first and second transistors 201, 202 of the middle shift register unit are turned off and the third transistor 203 of the middle shift register unit is turned on. As a result, the source electrode of the first transistor 201 of the middle shift register unit keeps a high voltage and the high voltage is applied to the gate electrode of the fourth transistor 204 of the middle shift register unit. The low voltage $V_{SS}$ is applied to the gate electrode of the fifth transistor 205 of the middle shift register unit via the third transistor 203. Therefore, the fourth transistor 204 is turned on and the fifth transistor 205 is turned off. The output voltage $V_{out2}$ of the middle shift register unit is pulled up by the first clock signal CK via the fourth transistor 204.

During the third period t3, the first clock signal CK is a low voltage signal and the second clock signal CKb is a high voltage signal. The output signal $V_{out1}$ of the pre-stage shift register unit is a low voltage signal. Thereby, the first and second transistors 201, 202 of the middle shift register unit are turned on and the third transistor 203 of the middle shift register unit is turned off. As a result, the high voltage $V_{DD}$ is applied to the gate electrode of the fifth transistor 205 of the middle shift register unit via the second transistor 202. The output signal $V_{out1}$ of the pre-stage shift register unit is applied to the gate electrode of the fourth transistor 204 of the middle shift register unit via the first transistor 201. Therefore, the fourth transistor 204 of the middle shift register unit is turned off and the fifth transistor 205 of the middle shift register unit is turned on. The output voltage $V_{out2}$ of the middle shift register is pulled down by the low voltage $V_{SS}$ via the fifth transistor 205.

The output voltage $V_{out2}$ of the middle shift register is applied to the signal input terminal $V_{IN}$ of the rear-stage shift register unit. As described above in the second period t2, the output voltage $V_{out3}$ of the rear-stage shift register is pulled up.

The shift register unit 200 includes the first to fifth transistors 201~205. That is, the shift register 20 utilizes fewer transistors to enable each of the shift register units 200 to function. Therefore, the shift register 20 has a smaller volume.

In each shift register unit 200, the second clock signal CKb is applied to the gate electrode of the second transistor 202 to control the second transistor 202 turning on/off. If the second transistor 202 is turned on, the high voltage $V_{DD}$ is applied to the gate electrode of the fifth transistor 205 to turn on the fifth transistor 205. Therefore, the output voltage of the shift register unit 200 is pulled down. That is, the shift register unit 200 does not need feedback signal from the rear-stage shift register unit to pull down the output voltage. As a result, the output voltage of the shift register unit 200 is pulled down to a low voltage more quickly. That is, the output voltage of the shift register unit 200 is pulled down before the output voltage of a rear-stage shift register unit 200 is pulled up. Therefore, two adjacent shift register unit 200 avoid outputting the same voltage at the same time. As a result, the TFTs connected to two adjacent data lines or gate lines of the LCD 2 may not be turned on at the same time. The LCD 2 employing the shift register 20 operates correctly.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shift register comprising:
   a plurality of shift register units connected one by one, each of the shift register units comprising:
   a signal input terminal;
   an output terminal outputting an output voltage;
   a first switch unit coupled to a first clock, input terminal and the signal input terminal;
   a second switch unit coupled to the first clock input terminal and a first voltage input terminal;
   a third switch unit coupled between the second switch unit and a second voltage input terminal, the third switch unit directly coupled to the second voltage input terminal;
   a fourth switch unit coupled between a second clock input terminal and the output terminal of the shift register unit; and
   a fifth switch unit coupled between the output terminal and the second voltage input terminal terminal,
   wherein the signal input terminal of each shift register unit is coupled to the output terminal of a rear-stage shift register unit, the first clock input terminal receives a first clock signal to turn on/off the first and second switch units, the third switch unit receives a second clock signal, the fourth switch unit pulls up the output voltage of the output terminal according to a first controlling signal from the first switch unit, the fifth switch unit pulls down the output voltage of the output terminal according to second and third controlling signals from the second and third switch units, and
   wherein in each of the shift register units, after the output terminal of the shift register unit outputs a high voltage signal, the first and second clock input terminals control the second and third switch units to be turned on and turned off alternately, and the first and second voltage input terminals control the fifth switch unit to be turned on and turned off alternately via the second and third switch units, respectively, such that the output terminal non-continuously receives a voltage of the second voltage input terminal via the fifth switch unit.

2. The shift register as claimed in claim 1, wherein the first switch unit is a first transistor, the first transistor comprises a gate electrode coupled to the first clock input terminal, a drain electrode coupled to the signal input terminal, and a source electrode.

3. The shift register as claimed in claim 2, wherein the fourth switch unit is a fourth transistor, the fourth transistor comprises a gate electrode coupled to the source electrode of the first transistor, a drain electrode coupled to the second clock input terminal, and a source electrode coupled to the output terminal of the shift register unit.

4. The shift register as claimed in claim 3, wherein the second switch unit is a second transistor, the second transistor comprises a gate electrode coupled to the first clock input terminal, a drain electrode coupled to the first voltage input terminal, and a source electrode.

5. The shift register as claimed, in claim 4, wherein the third switch unit is a third transistor, the third transistor comprises a gate electrode coupled to the second clock input terminal, a drain electrode coupled to the source electrode of the second transistor, and a source electrode directly coupled to the second voltage input terminal.

6. The shift register as claimed in claim 5, wherein the fifth switch unit is a fifth transistor, the fifth transistor comprises a gate electrode coupled to the source electrode of the second transistor, a drain electrode coupled to the output terminal of the shift register unit, and a source electrode coupled to the second voltage input terminal.

7. The shift register as claimed in claim 6, wherein each of the first, second, third, fourth, and fifth switch transistors is a N-channel metal-oxide semiconductor transistor.

8. The shift register as claimed in claim 6, wherein the first voltage input terminal receives a high voltage.

9. The shift register as claimed in claim 8, wherein the second voltage input terminal receives a low voltage.

10. The shift register as claimed in claim 1, wherein each of the first clock signal and the second clock signal is a continuous alternate square signal, and the first clock signal is a reverse signal of the second clock signal.

11. The shift register as claimed in claim 1, wherein each of the shift register unit further comprises a buffer connected between the source electrode of the fourth transistor and the output terminal of the shift register unit, the buffer being configured for reducing distortion of an output waveform of the shift register unit.

12. The shift register as claimed in claim 11, wherein the butter comprises two inverters connected in series.

13. A liquid crystal display comprising:
a drive circuit configured for driving the liquid crystal display, the drive circuit comprising:
a shift register configured for providing controlling signals to the liquid crystal display, the shift register comprising:
a plurality of shift register units connected one by one, each of the shift register units comprising:
a signal input terminal;
an output terminal outputting an output voltage;
a first switch unit coupled to a first clock input terminal and the signal input terminal;
a second switch unit coupled to the first clock, input terminal and a first voltage input terminal, the first voltage input terminal receiving a high voltage;
a third switch unit directly coupled between the second switch unit and a second voltage input terminal; the second voltage input terminal receiving a low voltage;
a fourth switch unit coupled between a second clock input terminal and the output terminal of the shift register unit; and
a fifth switch unit coupled between the output terminal and the second voltage input terminal,
wherein the signal input terminal of each shift register unit is coupled to the output terminal of a rear-stage shift register unit, the first clock input terminal receives a first clock signal to turn on/off the first and second switch units, the third switch unit receives a second clock, signal which is a reverse signal of the first clock signal from the second voltage input terminal, the fourth switch unit pulls up the output voltage of the output terminal according to a first controlling signal from the first switch unit, the fifth switch unit pulls down the output voltage of the output terminal according to second and third controlling signals from the second and third switch units, and
wherein in each of the shift register units, after the output terminal of the shift register unit outputs a high voltage signal, the first and second clock input terminals control the second and third switch units to be turned on and turned off alternately, and the first and second voltage input terminals control the fifth switch unit to be turned on and turned off alternately via the second and third switch units, respectively, such that the output terminal non-continuously receives the low voltage of the second input terminal via the fifth switch unit.

14. The liquid crystal display as claimed in claim 13, wherein the first switch unit is a first transistor, the first transistor comprises a gate electrode coupled to the first clock input terminal, a drain electrode coupled to the signal input terminal, and a source electrode.

15. The liquid crystal display as claimed in claim 14, wherein the fourth switch unit is a fourth transistor, the fourth transistor comprises a gate electrode coupled to the source electrode of the first transistor, a drain electrode coupled to the second clock input terminal, and a source electrode coupled to the output terminal of the shift register unit.

16. The liquid crystal display as claimed in claim 15, wherein the second switch unit is a second transistor, the second transistor comprises a gate electrode coupled to the first clock, input terminal, a drain electrode coupled to the first voltage input terminal, and a source electrode.

17. The liquid crystal display as claimed in claim 16, wherein the third switch unit is a third transistor, the third transistor comprises a gate electrode coupled to the second clock input terminal, a drain electrode coupled to the source electrode of the second transistor, and a source electrode coupled to the second voltage input terminal.

18. The liquid crystal display as claimed in claim 17, wherein the fifth switch unit is a fifth transistor, the fifth transistor comprises a gate electrode coupled to the source electrode of the second transistor, a drain electrode coupled to the output terminal of the shift register unit, and a source electrode directly coupled to the second voltage input terminal.

19. A shift register comprising:
a plurality of shift register units connected one by one, each of the shift register units comprising:
a signal input terminal;
an output terminal coupled to the signal input terminal of a rear-stage shift register unit;
a first switch unit comprising a first connecting terminal coupled to the signal input terminal, a second connecting terminal, and a control terminal receiving a first clock signal;
a second switch unit comprising a first connecting terminal receiving a high voltage, a second connecting terminal, and a control terminal receiving the first clock signal;
a third switch unit comprising a first connecting terminal coupled to the second connecting terminal of the second switch unit, a second connecting terminal receiving a low voltage, and a control terminal receiving a second clock signal which is a reverse signal of the first clock signal, the third switch unit being directly coupled to a low voltage terminal,
a fourth switch unit comprising a first connecting terminal receiving the second clock signal, a second connecting terminal coupled to the output terminal, and a control terminal coupled to the second connecting terminal of the first switch unit; and
a fifth switch unit comprising a first connecting terminal coupled to the output terminal, a second connecting terminal receiving the low voltage signal, a control terminal coupled to the second connecting terminal of the second switch units,
wherein in each of the shift register units, after the output terminal of the shift register unit outputs a high voltage signal, the first and second clock signals control the second and third switch units alternately to be turned on and turned off, respectively, such that the high voltage from the second switch unit and the low voltage from the third switch unit control the fifth switch unit to be turned on and turned off alternately, and the output terminal non-continuously receives the low voltage via the fifth switch unit.

20. The shift register as claimed in claim 19, wherein the second connecting terminal of the fifth switch unit is directly coupled to the low voltage terminal for receiving the low voltage.

* * * * *